US012571918B2

(12) United States Patent
Palmigiani et al.

(10) Patent No.: US 12,571,918 B2
(45) Date of Patent: Mar. 10, 2026

(54) IMAGE SENSOR

(71) Applicant: Commissariat à l'Énergie Atomique et aux Énergies Alternatives, Paris (FR)

(72) Inventors: Gaelle Palmigiani, Grenoble (FR); François Deneuville, Grenoble (FR); Olivier Saxod, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 366 days.

(21) Appl. No.: 18/198,316

(22) Filed: May 17, 2023

(65) Prior Publication Data

US 2023/0375711 A1    Nov. 23, 2023

(30) Foreign Application Priority Data

May 19, 2022    (FR) ...................................... 2204780

(51) Int. Cl.
*G01S 7/481*        (2006.01)
*G01B 11/22*        (2006.01)
(Continued)

(52) U.S. Cl.
CPC ............ *G01S 17/894* (2020.01); *G01B 11/22* (2013.01); *G01S 7/4816* (2013.01);
(Continued)

(58) Field of Classification Search
CPC ..... G01B 11/22; G01S 7/4816; G01S 17/894; H10F 39/18; H10F 39/1825; H10F 39/80;
(Continued)

(56) References Cited

U.S. PATENT DOCUMENTS

| 2011/0181749 A1 | 7/2011 | Yamada |
| 2019/0237499 A1 | 8/2019 | Roy |
| 2019/0348460 A1 | 11/2019 | Chen et al. |

FOREIGN PATENT DOCUMENTS

| EP | 3 270 419 A2 | 1/2018 | |
| WO | WO-2020262383 A1 * | 12/2020 | ............. H04N 25/77 |
| WO | WO-2022085722 A1 * | 4/2022 | ............ H10F 39/811 |

OTHER PUBLICATIONS

Preliminary Search Report for French Application No. 2204780, dated Dec. 7, 2022.

* cited by examiner

*Primary Examiner* — Mark R Gaworecki
(74) *Attorney, Agent, or Firm* — Wolf, Greenfield & Sacks, P.C.

(57)        ABSTRACT

A plurality of photosites each photosite including: a first photosensitive area formed in the semiconductor substrate that captures light in a first wavelength range; a second photosensitive area formed in the semiconductor substrate vertically in line with the first photosensitive area that captures light in a second wavelength range, different from the first wavelength range; a first area of collection of charges photogenerated in the first and second photosensitive areas, arranged on the side of a surface of the substrate opposite to the first photosensitive area; a first transfer gate vertically extending from the first photosensitive area to said surface, that transfers the charges photogenerated in the first photosensitive area to the second photosensitive area; and a second transfer gate, horizontally extending on said surface vertically in line with the second photosensitive area, that transfers the photogenerated charges from the second photosensitive area to the first charge collection area.

16 Claims, 5 Drawing Sheets

(51) Int. Cl.

| | | |
|---|---|---|
| *G01S 17/894* | (2020.01) | |
| *H10F 39/00* | (2025.01) | |
| *H10F 39/18* | (2025.01) | |

(52) U.S. Cl.
CPC ......... *H10F 39/1825* (2025.01); *H10F 39/80* (2025.01); *H10F 39/802* (2025.01); *H10F 39/8033* (2025.01); *H10F 39/8037* (2025.01); *H10F 39/812* (2025.01); *H10F 39/18* (2025.01); *H10F 39/807* (2025.01)

(58) Field of Classification Search
CPC ............... H10F 39/802; H10F 39/8033; H10F 39/8037; H10F 39/807; H10F 39/812
See application file for complete search history.

IMAGE SENSOR

CROSS-REFERENCE TO RELATED APPLICATION

This application claims priority to French application number 2204780, filed May 19, 2022. The contents of which is incorporated herein by reference in its entirety.

TECHNICAL BACKGROUND

The present disclosure generally concerns the field of image acquisition devices. The present disclosure more particularly concerns image acquisition devices adapted to acquiring a 2D image and a depth image of a scene by means of a same pixel array.

PRIOR ART

Image acquisition devices capable of acquiring a 2D image and a depth image of a scene are known. Particularly, devices comprising 2D image pixels and depth pixels forming part of a same pixel array of an image sensor are known.

SUMMARY OF THE INVENTION

There exists a need to improve existing devices of acquisition of a 2D image and of a depth image of a scene. It would more precisely be desirable to facilitate the integration of depth pixels in a pixel array of an image sensor adapted to acquiring 2D images and depth images.

An object of an embodiment is to overcome all or part of the disadvantages of known devices of acquisition of a 2D image and of a depth image of a scene. An embodiment more precisely aims at facilitating the integration of depth pixels in an array of pixels of an image sensor adapted to acquiring 2D images and depth images.

For this purpose, an embodiment provides an image sensor comprising a plurality of photosites formed inside and on top of a semiconductor substrate, each photosite comprising:

a first photosensitive area formed in the semiconductor substrate and adapted to capturing light in a first wavelength range;

a second photosensitive area formed in the semiconductor substrate vertically in line with the first photosensitive area and adapted to capturing light in a second wavelength range, different from the first wavelength range;

a first area of collection of charges photogenerated in the first and second photosensitive areas, arranged on the side of a surface of the substrate opposite to the first photosensitive area;

a first transfer gate, vertically extending from the first photosensitive area to said surface, adapted to transferring the charges photogenerated in the first photosensitive area to the second photosensitive area; and a second transfer gate, horizontally extending on said surface vertically in line with the second photosensitive area, adapted to transferring the photogenerated charges from the second photosensitive area to the first charge collection area.

According to an embodiment, each photosite further comprises:

at least one second area of collection of charges photogenerated in the second photosensitive area, arranged on the side of said surface; and at least a third transfer gate laterally extending, on said surface, vertically in line with the second photosensitive area.

According to an embodiment, each photosite further comprises:

a third photosensitive area, interposed between the first and second photosensitive areas; and a fourth transfer gate vertically extending, from the third photosensitive area, all the way to said surface and adapted to transferring the charges photogenerated in the third photosensitive area to the second photosensitive area.

According to an embodiment, the first charge collection area is common to the charges photogenerated in the first, second, and third photosensitive areas.

According to an embodiment, the first transfer gate surrounds the fourth transfer gate.

According to an embodiment, each photosite further comprises a peripheral insulating trench vertically extending in the semiconductor substrate, from said surface, and laterally delimiting the first photosensitive area.

According to an embodiment, each photosite further comprises a control circuit configured to alternately apply, on the first transfer gate:

a first potential adapted to blocking a charge transfer from the first photosensitive area to the second photosensitive area; and a second potential, different from the first potential, adapted to allowing a charge transfer from the first photosensitive area to the second photosensitive area.

According to an embodiment, the control circuit is configured to alternately apply, on the second transfer gate:

a third potential adapted to blocking a charge transfer from the second photosensitive area to the first charge storage area; and a fourth potential, different from the third potential, adapted to allowing a charge transfer from the second photosensitive area to the first charge storage area.

According to an embodiment, the sensor further comprises a fifth transfer gate, horizontally extending on said surface vertically in line with the second photosensitive area, the fifth transfer gate being adapted to transferring the photogenerated charges from the second photosensitive area to a second charge collection area.

According to an embodiment, the second and fifth transfer gates are successively opened during a phase of sampling of charges photogenerated in the second photosensitive area.

According to an embodiment, the second and fifth transfer gates are coupled together by a switch.

According to an embodiment, the first and second photosensitive areas of the photosites of the sensor are intended to respectively capture a 2D image and a depth image of a scene.

According to an embodiment, the first and second photosensitive areas are doped with the same conductivity type.

According to an embodiment, the first photosensitive area is doped with a first conductivity type and the second photosensitive area is doped with a second conductivity type, opposite to the first conductivity type.

An embodiment provides a device comprising:

an image sensor such as described;

an infrared radiation emission source; and a circuit for controlling the infrared radiation emission source and the image sensor.

BRIEF DESCRIPTION OF THE DRAWINGS

The foregoing and other features and advantages of the present invention will be discussed in detail in the following non-limiting description of specific embodiments in connection with the accompanying drawing, in which.

DESCRIPTION OF THE EMBODIMENTS

Figures 1, 2A, 2B:
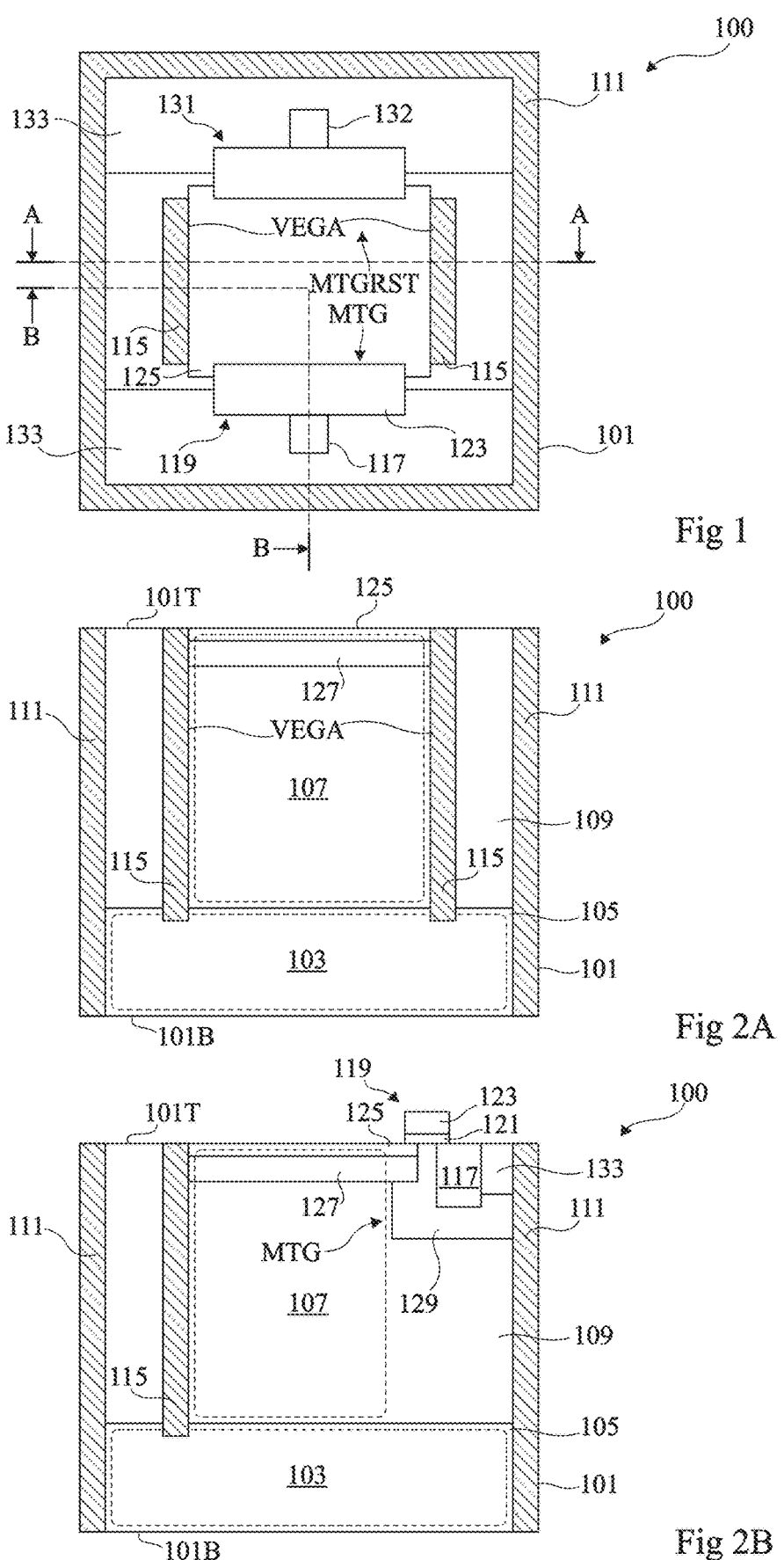
FIG. 1 is a simplified and partial top view of a photosite of an image sensor according to an embodiment.
FIG. 2A is a cross-section view, along plane AA of FIG. 1, of the photosite of FIG. 1.
FIG. 2B is a cross-section view, along plane BB of FIG. 1, of the photosite of FIG. 1.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the readout circuits, or column decoders, the control circuits, or row decoders, and the applications where image sensors may be provided have not been detailed, the described embodiments and variants being compatible with usual image sensor readout circuits and control circuits, as well as with usual applications implementing image sensors.

Further, the biasing of the MOS well and the passivation layers located along the sides of the vertical transfer gates and of the insulating trenches are not detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, "transmittance of a layer" designates a ratio of the intensity of the radiation coming out of the layer to the intensity of the radiation entering the layer. In the following description, a layer or a film is called opaque to a radiation when the transmittance of the radiation through the layer or the film is smaller than 10%. In the following description, a layer or a film is called transparent to a radiation when the transmittance of the radiation through the layer or the film is greater than 10%.

In the following description, "visible light" designates an electromagnetic radiation having a wavelength in the range from 380 nm to 780 nm and "infrared radiation" designates an electromagnetic radiation having a wavelength in the range from 780 nm to 15 μm. Further, "near infrared radiation" more precisely designates an electromagnetic radiation having a wavelength in the range from 750 nm to 1.1 μm.

A pixel of an image corresponds to the unit element of the image captured by an image sensor. When the image sensor is a color image sensor, it generally comprises, for each pixel of the color image to be acquired, a group of at least three photosites. Each of these three photosites acquires a light radiation substantially in a single color (for example, red, green, or blue), for example, in a wavelength range smaller than 100 nm. When the image sensor is a depth image sensor, it may comprise, for each pixel of the depth image to be acquired, one or a plurality of photosites, each enabling to acquire part of the depth information.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred unless specified otherwise to the orientation of the drawings.

Unless specified otherwise, the expressions "about", "approximately", "substantially", and "in the order of" signify plus or minus 10%, preferably of plus or minus 5%.

FIG. 1 is a simplified and partial top view of a photosite 100 of an image sensor according to an embodiment. FIGS. 2A and 2B are cross-section views, along planes AA and BB of FIG. 1, respectively, of the photosite 100 of FIG. 1.

In the shown example, photosite 100 is formed inside and on top of a semiconductor substrate 101, for example, made of silicon. As an example, layer 101 has a thickness in the range from 3 to 20 μm.

In this example, photosite 100 comprises a first photosensitive area 103 formed in semiconductor substrate 101. As illustrated in FIGS. 2A and 2B, the first photosensitive area 103 extends vertically across the thickness of semiconductor substrate 101 from a bottom surface 101B of substrate 101 down to a depth smaller than the thickness of substrate 101. In the illustrated example, the first photosensitive area 103 of photosite 100 has, in top view, a substantially square-shaped periphery. First photosensitive area 103 is for example formed in a first doped region 105 of semiconductor substrate 101 of a first conductivity type, for example, type N, and having a doping level N1.

First photosensitive area 103 may for example form a first photosensitive diode D1, or photodiode, for example a pinned photodiode having a pinning voltage Vpin1.

In the shown example, photosite 100 further comprises a second photosensitive area 107 formed in semiconductor substrate 101. Second photosensitive area 107 is located vertically in line with first photosensitive area 103 (above first photosensitive area 103, in the orientation of FIGS. 2A and 2B). In the illustrated example, second photosensitive area 107 extends vertically across the thickness of semiconductor substrate 101 from a top surface 101T of substrate 101 opposite to bottom surface 101B, down to a depth smaller than the thickness of substrate 101. In top view, second photosensitive area 107 for example, has a periphery of rectangular shape. Second photosensitive area 107 for example has lateral dimensions smaller than those of first photosensitive area 103. More precisely, in top view, the rectangle formed by second photosensitive area 107 is inscribed within the square formed by first photosensitive area 103. Second photosensitive area 107 is for example formed in a second doped region 109 of substrate 101 of the first conductivity type, type N in this example, and having a doping level N2. The doping rate N2 of the second region 109 of substrate 101 is for example greater than the doping level N1 of first region 105. In the shown example, the second region 109 of substrate 101 is in contact, by its bottom surface, with the top surface of the underlying first region 105. Further, in this example, second photosensitive area 107 is substantially in contact, by its bottom surface, with the top surface of the underlying first photosensitive area 103.

Second photosensitive area 107 may for example form a second photosensitive diode D2, for example, a pinned photodiode having a pinning voltage Vpin2. In this example, the pinning voltage Vpin2 of second photodiode D2 is higher than the pinning voltage Vpin1 of first photodiode D1.

Each photosensitive area 103, 107 is for example intended to collect incident photons, during phases of illumination of the image sensor comprising photosite 100, and to convert these photons into electron-hole pairs. In this example, first photosensitive area 103 is adapted to capturing light in a first wavelength range and second photosensitive area 107 is adapted to capturing light in a second wavelength range, different from the first wavelength range. The first and second photosensitive areas 103 and 107 are for example intended to respectively capture 2D images and depth images of a scene. As an example, the first photosensitive area 103 of photosite 100 is adapted to capturing visible light, for example, blue light, and the second photosensitive areas 107 of photosite 100 is adapted to capturing an infrared radiation, for example, a near infrared radiation, when photosite 100 is illuminated on the side of its bottom surface 101B.

In a case where the first and second photosensitive areas 103 and 107 are made of the same material, for example, silicon, the visible light and the infrared radiation are mainly absorbed at different depths in semiconductor substrate 101 from its bottom surface 101B. In this case, the main absorption depth of visible light is smaller than that of the infrared radiation. Second photosensitive area 107 may for example have a thickness greater than that of first photosensitive area 103 to optimize the absorption of the infrared radiation in second photosensitive area 107.

In the shown example, photosite 100 further comprises a peripheral insulating trench 111, for example, a capacitive insulating trench, laterally delimiting first photosensitive area 103. More precisely, in this example, peripheral insulating trench 111 borders all the lateral surfaces of first photosensitive area 103 and has, in top view, a substantially square-shaped periphery.

Peripheral insulating trench 111 enables to electrically insulate the first and second photosensitive areas 103 and 107 of photosite 100 from the photosensitive areas of the neighboring photosites, not shown in FIGS. 1, 2A, and 2B. Peripheral insulating trench 111 is formed in substrate 101. In the orientation of FIGS. 2A and 2B, peripheral insulating trench 111 extends vertically across the thickness of substrate 101, from the top surface 101T of substrate 101, down to the bottom surface 101B of substrate 101. In other words, peripheral insulating trench 111 extends vertically, in this example, across the entire thickness of substrate 101 and emerges on the side of the top 101T and bottom 101B surfaces of substrate 101.

Peripheral insulating trench 111 for example has a width in the range from 30 to 600 nm, and a depth in the range from 5 to 20 μm. In the example illustrated in FIGS. 2A and 2B, peripheral insulating trench 111 has a depth equal to the thickness of substrate 101.

Although this has not been detailed in FIGS. 1, 2A, and 2B, peripheral insulating trench 111 for example comprises an electrically-conductive region having its lateral walls coated with an electrically-insulating layer. This layer electrically insulates the electrically-conductive region of trench 111 from substrate 101. As an example, the electrically-conductive region of trench 111 is made of polysilicon or of a metal, for example copper, or of a metal alloy, and the electrically-insulating layer of trench 111 is made of a dielectric material, for example, of silicon oxide. As an example, peripheral insulating trench 111 is a trench of CDTI type ("Capacitive Deep Trench Isolation") or capacitive deep insulating trench.

In the example illustrated in FIGS. 1, 2A, and 2B, photosite 100 further comprises a vertical transfer gate VEGA adapted to transferring the charges photogenerated in first photosensitive area 103 to the second photosensitive area 107. More precisely, a circuit for controlling photosite 100 may be used to alternately apply, on vertical transfer gate VEGA:

a first potential adapted to blocking a charge transfer from first photosensitive area 103 to second photosensitive area 107; or a second potential, different from the first potential, adapted to allowing a charge transfer from first photosensitive area 103 to second photosensitive area 107.

In this example, vertical transfer gate VEGA comprises two separate insulating trenches 115, for example capacitive insulating trenches. As illustrated in FIGS. 2A and 2B, each insulating trench 115 of vertical transfer gate VEGA vertically extends across the thickness of semiconductor substrate 101 from the top surface 101T of substrate 101 down to first photosensitive area 103, and partially penetrates into first photosensitive area 103 down to a depth corresponding to that of peripheral insulating trench 111. In other words, each insulating trench 115 stops across the thickness of the first region 105 of substrate 101 and does not emerge onto the side of the bottom surface 101B of substrate 101. In this example, each insulating trench 115 totally crosses the second region 109 of substrate 101 and partially penetrates into first region 105. As an example, each insulating trench 115 has a depth in the range from 3 to 18 μm.

In the shown example, insulating trenches 115 form two plates substantially parallel to each other and bordering two opposite lateral surfaces of second photosensitive area 107. In this example, insulating trenches 115 are further, in top view, substantially parallel to two opposite sides of peripheral insulating trench 111.

Generally, vertical transfer gate VEGA comprises at least first and second plates parallel to each other, each plate for example comprising a conductive plate coated with an insulating layer, second photosensitive layer 107 laterally extending from a surface of the first plate to a surface of the second plate located in front of the first plate. In other words, second photosensitive area 107 extends inside of a volume laterally delimited by at least two plates forming part of vertical transfer gate VEGA.

In this example, the pinning voltages Vpin1 and Vpin2 of diodes D1 and D2 may be adjusted by modifying the doping levels N1 and N2 of photosensitive areas 103 and 107. Voltages Vpin1 and Vpin2 may further be adjusted by respectively modifying a distance between the two opposite walls of peripheral insulating trench 111 parallel to insulating trenches 115 and the width of vertical transfer gate VEGA, in other words the distance between the two insulating trenches 115. Voltages Vpin1 and Vpin2 further depend on a voltage for biasing an inversion layer passivating the sides of trench 111, for photosensitive area 103, and of trenches 115, for photosensitive area 107. This bias voltage is for example identical for the two photosensitive areas 103 and 107. In this example, the voltage for biasing the inversion layer does not enable to adjust the pinning voltages Vpin1 and Vpin2 independently from each other.

Each insulating trench 115 of vertical transfer gate VEGA for example has a structure similar to that of peripheral insulating trench 111. More precisely, although this has not been detailed in FIGS. 1, 2A, and 2B, each insulating trench 115 for example comprises an electrically-conductive region, for example, made of polysilicon or of a metal, for example, copper, or of a metal alloy. The electrically-conductive region of each insulating trench 115 is for example made of the same material as the electrically-conductive region of peripheral insulating trench 111. Further, each trench 115 for example comprises an electrically-insulating layer coating the lateral walls and the bottom surface of the electrically-conductive region. This layer electrically insulates the electrically-conductive region of trench 115 from substrate 101. As an example, the electrically-insulating layer of each trench 115 is made of a dielectric material, for example, of silicon oxide. The electrically-insulating layer of each insulating trench 115 is for example made of the same material as the electrically-insulating layer of peripheral insulating trench 111.

The electrically-conductive region of each insulating trench 115 is for example electrically insulated from the electrically-conductive region of peripheral insulating trench 111. This for example enables to bias the electrically-conductive regions of insulating trenches 115 independently from the electrically-conductive region of peripheral insulating trench 111.

In the shown example, photosite 100 further comprises a same area 117 of collection of the charges photogenerated in first and second photosensitive areas 103 and 107, arranged on the side of the top surface 101T of semiconductor substrate 101 opposite to first photosensitive area 103. In the orientation of FIG. 2B, charge collection area 117 vertically extends across the thickness of substrate 101 from its top surface 101T and down to a depth smaller than that of insulating trenches 115. Charge collection area 117 for example corresponds to a third doped region of substrate 101 of the first conductivity type, type N in this example, and having a doping level N4 for example in the range from $1 \times 10^{16}$ to $5 \times 10^{20}$ at./cm$^3$ (N$^+$ doping).

In this example, photosite 100 further comprises a horizontal transfer gate 119 adapted to transferring the charges from second photosensitive area 107 to charge collection area 117. More precisely, a circuit for controlling photosite 100 may be used to alternately apply, on horizontal transfer gate 119:

a third potential adapted to blocking a charge transfer from second photosensitive area 107 to charge collection area 117; or a fourth potential, different from the third potential, adapted to allowing a charge transfer from second photosensitive area 107 to charge collection area 117.

In the illustrate example, horizontal transfer gate 119 horizontally extends on the top surface 101T of semiconductor substrate 101 vertically in line with second photosensitive area 107. Transfer gate 119 more precisely comprises an electrically-insulating layer 121, for example, made of silicon oxide, coating a portion of the top surface 101T of semiconductor substrate 101 and an electrically-conductive layer 123, for example, made of doped polysilicon, coating a top surface of electrically-insulating layer 121.

In the shown example, semiconductor substrate 101 further comprises a fourth doped region 125 of a second conductivity type, type P in this example, opposite to the first conductivity type and having a doping level P1. In this example, fourth region 125 vertically extends across the thickness of substrate 101 from the top surface 101T of substrate 101 and down to a depth smaller than that of charge collection area 117. Fourth region 125 for example horizontally extends between the insulating trenches 115 of vertical transfer gate VEGA.

Substrate 101 for example further comprises a fifth doped region 127 of the first conductivity type, type N in this example, and having a doping level N3. The doping level N3 of fifth region 127 is for example higher than the doping level N2 of second region 109 and lower than the doping level N4 of area 117. Fifth region 127 is for example located vertically in line with fourth region 125. In this example, the fourth region 125 of substrate 101 is in contact, by its bottom surface, with the top surface of the underlying fifth region 127. In this example, fifth region 127 vertically extends across the thickness of substrate 101 from the bottom surface of fourth region 125 and down to a depth smaller than that of charge collection area 117.

In the shown example, semiconductor substrate 101 further comprises a sixth doped region 129 of the second conductivity type, type P in this example, and having a doping level P2. In this example, sixth region 129 vertically extends across the thickness of substrate 101 from the top surface 101T of substrate 101 and down to a depth greater than that of charge collection area 117 and of the fifth region 127 of substrate 101. Sixth region 129 is for example interposed between the fourth and fifth regions 125 and 127, on the one hand, and charge collection area 117, on the other hand. Further, sixth region 129 may, as in the example illustrated in FIG. 2B, horizontally extend under the fifth region 127 of substrate 101 and under charge collection area 117. In this example, region 129 further extends all the way to peripheral insulating trench 111.

In this example, the electrically-conductive layer 123 and the electrically-insulating layer 121 of transfer gate 119 respectively correspond to a gate electrode and to a gate insulator of a transistor MTG for transferring the charges photogenerated in the first and second photosensitive areas 103 and 107, for example a MOS ("Metal Oxide Semiconductor") transistor. Further, the third, fifth, and sixth regions 117, 127, and 129 of substrate 101 respectively correspond to drain, source, and channel regions of transistor MTG. The fourth region 125 of substrate 101 for example enables to passivate the surface of fifth region 127.

As an example, the first, second, third, fourth, fifth, and sixth regions 105, 109, 117, 125, 127, and 129 are formed by ion implantation in semiconductor substrate 101.

In the shown example, photosite 100 further comprises another horizontal transfer gate 131 adapted to transferring charges from second photosensitive area 107 to a reset node, not shown, of photosite 100. Transfer gate 131 for example has a structure identical or similar to that of transfer gate 119 and will not be described in detail hereafter. More precisely, transfer gate 131 for example forms part of another transfer transistor MTGRST, for example, a MOS transistor for resetting photosensitive areas 103 and 107. Reset transistor MTGRST for example has a structure identical or similar to that of transfer transistor MTG. In particular, transistor MTGRST for example comprises a charge collection area 132 identical or similar to the charge collection area 117 of transistor MTG. In the shown example, second charge collection area 132 laterally extends on the top surface 101T of substrate 101 vertically in line with second photosensitive area 107.

In the illustrated example, photosite 100 further comprises insulating trenches 133 located on either side of second photosensitive area 107. Insulating trenches 133 vertically extend across the thickness of semiconductor substrate 101, from its top surface 101T, down to a depth for example smaller than the thickness of charge collection area 117. In this example, insulating trenches 133 further horizontally extend in a direction substantially perpendicular to the plates formed by the insulating trenches 115 of vertical transfer gate VEGA. In the shown example, the bottom of each trench 133 is on top of and in contact with region 129. As an example, insulating trenches 133 are trenches of STI ("Shallow Trench Isolation") type, or shallow insulating trenches, and for example have a depth in the order of 300 nm.

Figures 3, 4, 5:
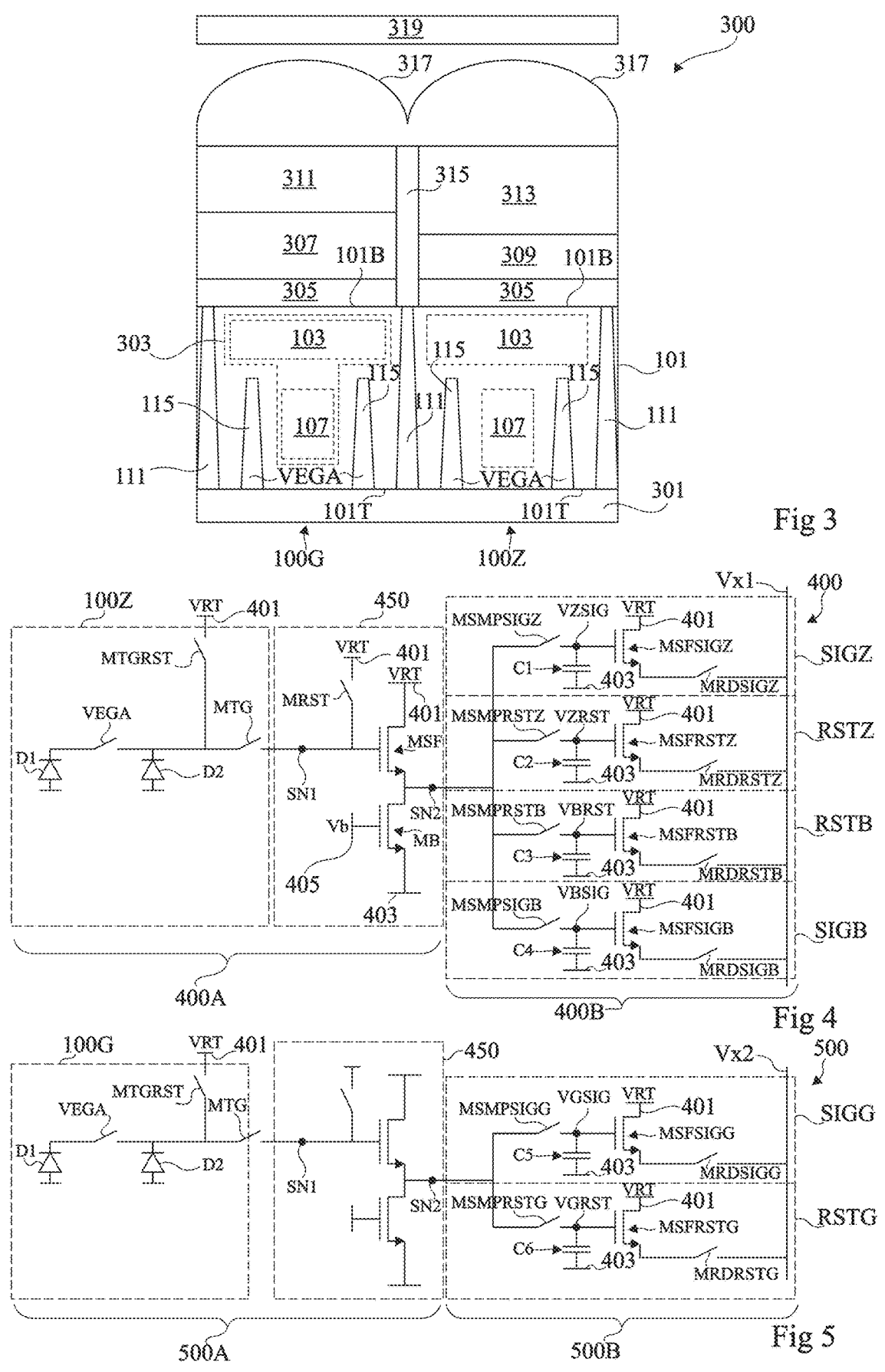
FIG. 3 is a simplified and partial cross-section view of an image sensor comprising a plurality of photosites of the type of the photosite of FIG. 1 according to an embodiment.
FIG. 4 is an electric diagram of a circuit for controlling the photosite of FIG. 1 according to an embodiment.
FIG. 5 is an electric diagram of a circuit for controlling the photosite of FIG. 1 according to another embodiment.

FIG. 3 is a simplified and partial view of an image sensor 300 comprising a plurality of photosites of the type of the photosite 100 of FIG. 1 according to an embodiment. The portion of sensor 300 visible in FIG. 3 more precisely comprises a photosite 100G adapted to only capturing visible light, for example, green light, and a photosite 100Z adapted to capturing both an infrared radiation and visible light, for example, blue light. The photosites 100G and 100Z of FIG. 3 for example each have a structure identical or similar to that of the photosite 100 of FIG. 1. Although only two photosites 100G and 100Z of the type of photosite 100 have been shown in FIG. 3, image sensor 300 may of course comprise a total number of photosites 100G and 100Z much greater than that illustrated in FIG. 3, for example, several thousands or several millions of photosites 100G and 100Z.

In the shown example, the photosites 100G and 100Z of sensor 300 are on top of and in contact with, on the side of their surface 101T (the bottom surface, in the orientation of FIG. 3), an interconnection network 301 enabling to control photosites 100G and 100Z. Interconnection network 301 for example comprises a stack of metallization levels separated from one another by dielectric layers. Each metallization level of network 301 typically comprises a plurality of separate portions, electrically insulated from one another, of a same metal layer. Interconnection network 301 may further comprise conductive vias enabling to interconnect a plurality of portions of metal layers forming part of distinct metallization levels. For simplification purposes, the metallization levels, the dielectric layers, and the conductive vias have not been detailed in FIG. 3.

In the example of image sensor 300, the first photosensitive area 103 of photosite 100Z is adapted to capturing visible light, for example blue light, and the second photosensitive area 107 of photosite 100Z is adapted to capturing an infrared radiation, for example, a near-infrared radiation.

In this example, the photosensitive areas 103 and 107 of photosite 100G are both adapted to capturing visible light, for example, green light. As an example, the vertical transfer gate VEGA of photosite 100G may be permanently controlled to the conductive state. In this case, the first and second photosensitive areas 103 and 107 of photosite 100G are for example gathered, or shared, thus forming a single photosensitive area 103.

In the shown example, each photosite 100G, 100Z is coated, on the side of its surface 101B (the top surface, in the orientation of FIG. 3), with an antireflection and passivation layer 305.

In this example, the layer 305 of photosite 100G is coated with a resin layer 307. As an example, resin layer 307 acts as a color filter adapted to only letting through green light, for example, in the wavelength range from 510 to 570 nm. Further, the layer 305 of photosite 100Z is coated with a resin layer 309 different from layer 307. As an example, resin layer 309 acts as a color filter adapted to only letting through blue light, for example, in the wavelength range from 430 to 490 nm.

In the shown example, the resin layer 307 of photosite 100G is coated with another resin layer 311. As an example, resin layer 311 acts as a filter adapted to letting through visible light, for example, in the wavelength range from 400 to 700 nm, layer 311 being for example opaque to a wavelength range or band centered on approximately 940 nm. Further, the resin layer 309 of photosite 100Z is coated with a resin layer 313. Layer 313 is for example transparent to visible light and to infrared radiations and enables to compensate for a height difference between the layer 309 of photosite 100Z and the layer 311 of photosite 100G.

In the shown example, the layers 305, 307, and 311 of photosite 100G are separated from the layers 305, 309, and 313 of photosite 100Z by a vertical optical isolation barrier 315. Vertical barrier 315 enables for example to avoid optical crosstalk phenomena between the different photosites 100G, 100Z of sensor 300.

In this example, each photosite 100G, 100Z is further topped with a microlens 317.

Layer 313 is for example made of the same material as microlenses 317. As a variant, layer 313 is made of silicon dioxide ($SiO_2$).

As illustrated in FIG. 3, a dual-band filter 319 may be arranged above microlenses 317. Filter 319 is for example adapted to only letting through visible light and an infrared radiation having a wavelength equal to approximately 940 nm.

For the acquisition of 2D color images, the photosites of image sensor 300 are for example distributed in elementary groups of four photosites, each group more precisely comprising a photosite 100Z adapted to capturing blue light and an infrared radiation, called blue and depth photosite, two photosites 100G adapted to only capturing green light, called green photosites, and a photosite adapted to only capturing red light, called red photosite. The red photosite for example has a structure similar to that previously described for the green photosite 100G. More precisely, the red photosite for example differs from the green photosite 100G in that the resin layer 307 of the red photosite is adapted to only letting through red light, for example, in the wavelength range from 620 to 700 nm. As an example, the photosite of image sensor 300 are arranged in a Bayer array.

Image sensor 300 is for example adapted to acquiring, in addition to the 2D color images of a scene, depth images of the scene. The depth images are for example acquired by image sensor 300 by implementing a distance measurement by indirect time of flight (iToF). For this purpose, an incident infrared radiation, or signal, amplitude-modulated at a modulation frequency Fmod is for example emitted by a source towards the scene. The radiation, or signal, reflected by the scene, having with respect to the incident radiation a phase shift $\Delta\varphi$, is captured by the photosites 100Z of image sensor 300. For each photosite, the phase shift $\Delta\varphi$ of the radiation captured by the photosite is a function of the distance between the device and a point or a region of the scene seen by the photosite.

As an example, for each pixel of a depth image to be acquired by image sensor 300, a group of four neighboring photosites 100Z is used to sample the signal reflected by the scene, to estimate phase shift Δφ (modulo 2n). More precisely, the four photosites 100Z are for example configured to acquire, during each modulation period (frequency Fmod) of the reflected signal, four successive samples, each corresponding to a quantity of charges photogenerated in the second photosensitive area 107 of photosite 100Z for a duration equal to approximately one quarter of the period of the reflected signal, and then transferred to a storage area. These four samples are cumulated or integrated over a plurality of periods of the reflected signal, for example, over several thousands or millions of periods, and enable to trace back the phase shift Δφ between the incident wave and the reflected wave.

As a variant, it may be provided to use, for each pixel of the depth image to be acquired, only three neighboring photosites. In this case, the three photosites 100Z are for example configured to acquire, during each period of the reflected signal, three successive samples, each corresponding to a quantity of charges photogenerated during sampling windows each equal to approximately one third of the period of the reflected signal.

As a variant, it may be provided to use for example, two photosites 100Z to acquire the four samples, each of the two photosites 100Z adapted to forming a same pixel of the depth image being for example used to acquire two successive sub-images. More precisely, the two photosites 100Z are for example configured to acquire, during a first acquisition phase, the samples corresponding to first and second quarters of the light signal modulation period, and, during a second acquisition phase, the samples corresponding to third and fourth quarters of the light signal modulation period. The combination of the two sub-images enables to obtain the four samples from which phase shift Δφ is calculated to form the depth image.

The acquisition of a plurality of samples by a same photosite advantageously enables to increase the sensor resolution. As an example, as compared with a case where each photosite is configured to acquire a single sample, the sensor resolution may be increased by providing for each photosite to be configured to acquire two or three samples, each pixel of the depth image being obtained by means of two photosites or of a single photosite, respectively. Further, the acquisition of a plurality of samples by a same photosite advantageously enables to increase the image capture rate. As an example, in a case where two photosites are used to restore each pixel of the depth image, two images are used to calculate the distance if each photosite captures a single sample while a single image is used to calculate the distance if each photosite captures two samples. However, the fact of acquiring a plurality of samples by means of a same photosite tends to increase the dimensions of the photosite.

FIG. 4 is an electric diagram of a circuit 400 for controlling the photosite 100 of FIG. 1 according to an embodiment. Circuit 400 is for example more precisely used in the case where photosite 100 is implemented as a photosite 100Z adapted to capturing blue light and an infrared radiation.

In the example illustrated in FIG. 4, control circuit 400 comprises a first level 400A, dedicated to the collection of the charges photogenerated in the first and second photosensitive areas 103 and 107 of photosite 100Z, and a second level 400B, dedicated to the storage and to the reading of the charges originating from first level 400A.

In the first level 400A of circuit 400, vertical transfer gate VEGA couples the cathode of the first pinned photodiode D1 to the cathode of the second pinned photodiode D2. Vertical transfer gate VEGA enables to transfer charges photogenerated in photodiode D1 to photodiode D2. Further, in this example, transfer transistor MTGRST, symbolized in FIG. 4 by a switch, couples the cathode of second pinned diode D2 to a node 401 of application of a power supply potential VRT of photosite 100Z. Potential VRT is for example used as a reset potential. Transfer transistor MTG, symbolized in FIG. 4 by a switch, couples the cathode of diode D2 to a first charge storage node SN1. Transistor MTG allows the transfer of charges from photodiode D2 to node SN1. Node SN1 is for example connected to area 117 of collection of charges photogenerated in the first and second photosensitive areas 103 and 107. In the shown example, node SN1 forms part of a circuit for copying, or transferring, the potential present at node SN1 onto another charge storage node SN2.

In this example, circuit 450 comprises a switch MRST, for example, a MOS transistor, coupling node SN1 to node 401 of application of power supply potential VRT.

Switch MRST for example enables to reset node SN1 by applying potential VRT thereto. In the example illustrated in FIG. 4, node SN1 is connected to a gate electrode of a transistor MSF of circuit 450, for example, a MOS transistor, having its drain and source electrodes respectively connected to the node 401 of application of potential VRT and to the second charge storage node SN2. Transistor MSF, assembled as a voltage follower, for example enables to copy, onto node SN2, the voltage present at node SN1, to within a gate-source voltage. Further, in this example, node SN2 is connected to a drain electrode of another transistor MB of circuit 450, for example, a MOS transistor, having its source and gate electrodes respectively connected to a node 403 of application of a reference potential, for example, the ground, and to a node 405 of application of a potential Vb, for example, associated with a common bias voltage of circuit 400. Transistor MB is, in this example, assembled as a current source and enables to power transistor MSF with a constant current In the shown example, the second level 400B of circuit 400 comprises four branches SIGZ, RSTZ, RSTB and SIGB, each coupling the node SN2 of circuit 450 to a column Vx1. Column Vx1 is for example connected to a readout circuit, not shown in FIG. 4, located at the foot of a column.

In this example, branches SIGZ, RSTZ, RSTB, SIGB respectively comprise:
a first switch MSMPSIGZ, MSMPRSTZ, MSMPRSTB, MSMPSIGB coupling node SN2 to a node VZSIG, VZRST, VBRST, VBSIG;
a capacitive element C1, C2, C3, C4 comprising a first terminal connected to node VZSIG, VZRST, VBRST, VBSIG and a second terminal connected to node 403 of application of the reference potential;
a transistor MSFSIGZ, MSFRSTZ, MSFRSTB, MSFSIGB comprising a gate terminal connected to node VZSIG, VZRST, VBRST, VBSIG and a drain terminal connected to node 401 of application of potential VRT; and
a second switch MRDSIGZ, MRDRSTZ, MRDRSTB, MRDSIGB coupling a source terminal of transistor MSFSIGZ, MSFRSTZ, MSFRSTB, MSFSIGB to column Vx1.

As an example, the switches and the transistors of the branches SIGZ, RSTZ, RSTB, and SIGB of circuit 400 are MOS transistors.

In this example, switches MSMPSIGZ, MSMPRSTZ, MSMPRSTB, MSMPSIGB are used as multiplexing switches between node SN2 and the corresponding capacitive element C1, C2, C3, C4 by for example allowing a write access to these capacitive elements. MOS transistors MSFSIGZ, MSFRSTZ, MSFRSTB, MSFSIGB are assembled as voltage followers and are for example used to copy onto their source, to within a gate-source voltage, the voltage stored by the corresponding capacitive element C1, C2, C3, C4. Switches MRDSIGZ, MRDRSTZ, MRDRSTB, MRDSIGB are used as switches of connected to column Vx1 and enable to apply, to column Vx1, the source voltage of the corresponding transistor MSFSIGZ, MSFRSTZ, MSFRSTB, MSFSIGB.

Control circuit 400 advantageously enables to simultaneously integrate charges photogenerated in the photosensitive areas 103 and 107 of photodiodes D1 and D2, to sample the charges photogenerated in photodiode D2 in parallel with the integration in photodiodes D1 and D2, and to successively read, via a same electric path, signals enabling to restore a depth image and a 2D image of a scene.

In the example illustrated in FIG. 4, control circuit 400 is compatible with an operation of the image sensor in a so-called global shutter mode. However, those skilled in the art are capable of adapting circuit 400 to make it compatible with an operation of the image sensor in so-called a rolling shutter mode.

FIG. 5 is an electric diagram of a circuit 500 for controlling the photosite 100 of FIG. 1 according to another embodiment. The circuit 500 of FIG. 5 comprises elements in common with the circuit 400 of FIG. 4. These common elements will not be described again in detail hereafter. Circuit 500 is for example more precisely used in the case where photosite 100 is implemented as a photosite 100G adapted to capturing green light.

In the shown example, circuit 500 comprises a first level 500A identical to the first level 400A of circuit 400. In this example, circuit 500 further comprises a second level 500B. The second level 500B of circuit 500 for example differs from the second level 400B of circuit 400 in that the second level 500B of circuit 500 only comprises two branches SIGG and RSTG, each coupling the node SN2 of circuit 450 to a column Vx2, for example, different from column Vx1. The branches SIGG and RSTG of circuit 500 for example have structures similar to those of the branches SIGB and RSTB, respectively, of the circuit 400 of FIG. 4.

More precisely, in this example, branches SIGG and RSTG respectively comprise:

a first switch MSMPSIGG, MSMPRSTG coupling node SN2 to a node VGSIG, VGRST:

a capacitive element C5, C6 comprising a first terminal connected to node VGSIG, VGRST and a second terminal connected to node 403 of application of the reference potential;

a transistor MSFSIGG, MSFRSTG comprising a gate terminal connected to node VGSIG, VGRST and a drain terminal connected to node 401 of application of potential VRT; and a second switch MRDSIGG, MRDRSTG coupling a source terminal of transistor MSFSIGG, MSFRSTG to column Vx2.

As an example, the switches and the transistors of the branches SIGG and RSTG of circuit 500 are MOS transistors.

Transistors MSMPSIGG, MSMPRSTG, MSFSIGG, MSFRSTG, MRDSIGG, and MRDRSTG for example have functions similar to those previously disclosed for transistors MSMPSIGB, MSMPRSTB, MSFSIGB, MSFRSTB, MRDSIGB, and MRDRSTB, respectively.

Although there has been described in relation with FIG. 5 an embodiment where circuit 500 is used to control a photosite 100G adapted to capturing green light, those skilled in the art are capable of adapting circuit 500 to control a photosite adapted to capturing red light. More precisely, a circuit identical to circuit 500 could be used.

For simplification, there have been disclosed hereabove in relation with FIGS. 4 and 5 control circuits 400 and 500 using a same power supply voltage VRT on each branch SIGZ, RSTZ, SIGB, RSTB, SIGG, and RSTG. As an example, it could be provided to use different power supply voltages on all or part of these branches.

Further, there have been disclosed hereabove in relation with FIGS. 4 and 5 circuits 400 and 500 having their second levels 400B and 500B comprising, for each capacitive element C1, C2, C3, C4, C5, C6, a transistor MSFSIGZ, MSFRSTZ, MSFRSTB, MSFSIGB, MSFSIGG, MSFRSTG having its gate connected to one of the terminals of the corresponding capacitive element and having its source coupled to the corresponding column Vx1, Vx2 by a switch MRDSIGZ, MRDRSTZ, MRDRSTB, MRDSIGB, MRDSIGG, MRDRSTG. As a variant, it may be provided for all the capacitive elements of a same second level 400B, 500B to be coupled, by switches, to the gate of a single readout transistor having its source coupled, by another transistor, to the corresponding column Vx1, Vx2, and in order for the potential applied to the gate of the readout transistor to be reset by means of still another transistor.

The implementation of this variant is within the abilities of those skilled in the art based on the indications of the present disclosure.

Figures 6, 7:
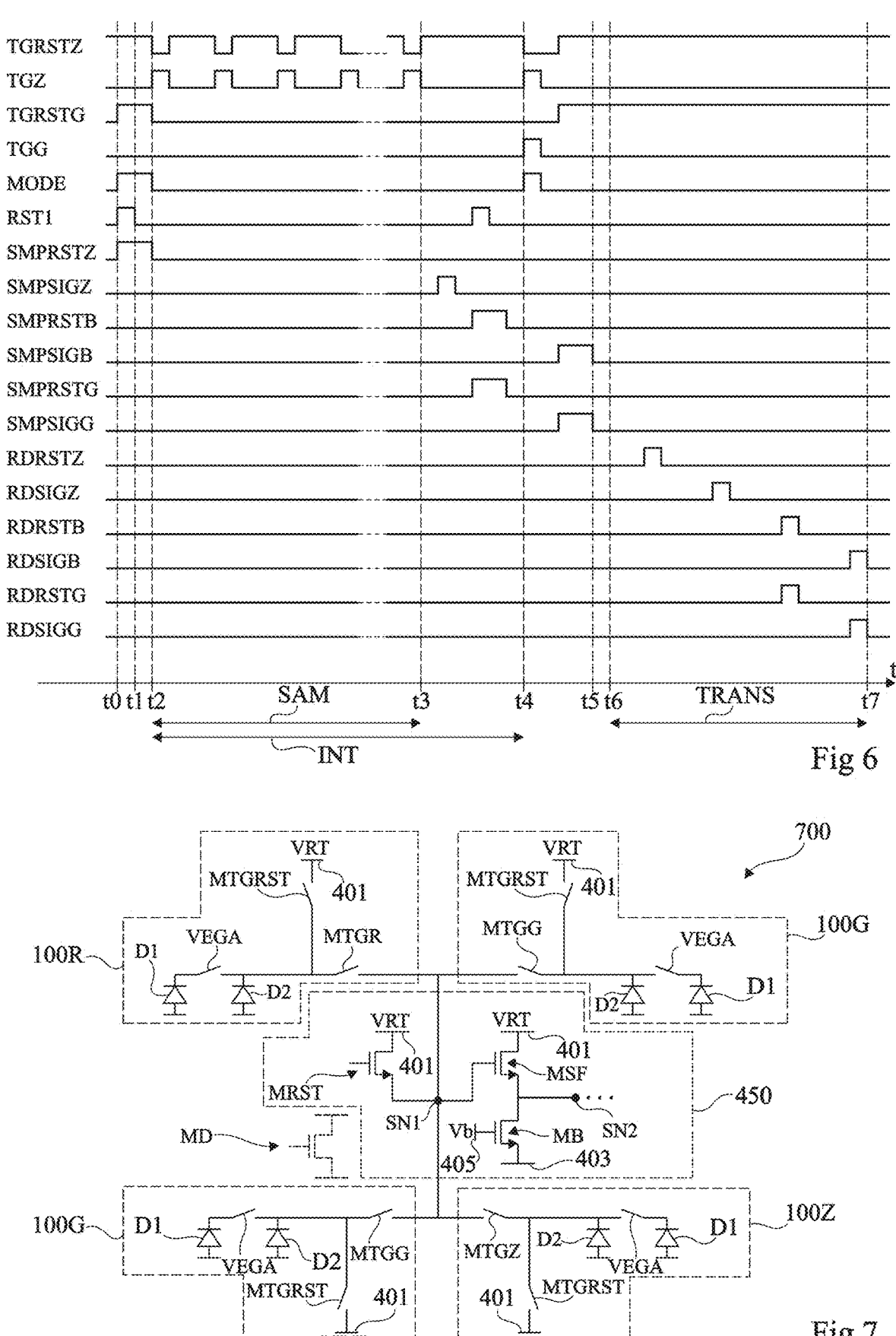
FIG. 6 is a timing diagram illustrating an implementation mode of a method of controlling photosites of the image sensor of FIG. 3.
FIG. 7 is an electric diagram of a circuit for controlling four photosites of the type of the photosite of FIG. 1 according to an embodiment.

FIG. 6 is a timing diagram illustrating an implementation mode of a method for controlling the photosites 100Z and 100G of the image sensor 300 of FIG. 3 respectively controlled by the circuits 400 and 500 of FIGS. 4 and 5.

More precisely, FIG. 6 illustrates the variation, over time t:

of a signal TGRSTZ for controlling the transfer transistor MTGRST of photosite 100Z;

of a signal TGZ for controlling the transfer transistor MTG of photosite 100Z;

of a signal TGRSTG for controlling the transfer transistor MTGRST of photosite 100G;

of a signal TGG for controlling the transfer transistor MTG of photosite 100G;

of a signal MODE for controlling the vertical transfer gates VEGA of photosites 100Z and 100G or, as a variant, of the vertical transfer gate VEGA of photosite 100Z only;

of a signal RST1 for controlling the switches MRST of photosites 100Z and 100G;

of a signal SMPRSTZ for controlling the switch MSMPRSTZ of the branch RSTZ of the second level 400B of circuit 400;

of a signal SMPSIGZ for controlling the switch MSMPSIGZ of the branch SIGZ of the second level 400B of circuit 400;

of a signal SMPRSTB for controlling the switch MSMPRSTB of the branch RSTB of the second level 400B of circuit 400;

of a signal SMPSIGB for controlling the switch MSMPSIGB of the branch SIGB of the second level 400B of circuit 400;

of a signal SMPRSTG for controlling the switch MSM-PRSTG of the branch RSTG of the second level 500B of circuit 500;

of a signal SMPSIGG for controlling the switch MSMPSIGG of the branch SIGG of the second level 500B of circuit 500;

of a signal RDRSTZ for controlling the switch MRDRSTZ of the branch RSTZ of the second level 400B of circuit 400;

of a signal RDSIGZ for controlling the switch MRDSIGZ of the branch SIGZ of the second level 400B of circuit 400;

of a signal RDRSTB for controlling the switch MRDRSTB of the branch RSTB of the second level 400B of circuit 400;

of a signal RDSIGB for controlling the switch MRDSIGB of the branch SIGB of the second level 400B of circuit 400;

of a signal RDRSTG for controlling the switch MRDRSTG of the branch RSTG of the second level 500B of circuit 500; and of a signal RDSIGG for controlling the switch MRDSIGG of the branch SIGG of the second level 500B of circuit 500.

In the method illustrated in FIG. 6, each control signal has high and low states. In this example, the switch is on, or the transistor is conductive, when the corresponding control signal is in the high state and the switch is off, or the transistor is non-conductive, when the corresponding control signal is in the low state. This example is however not limiting, those skilled in the art being capable of adapting what is described in relation with FIG. 6 to the case where the switch is on when the corresponding control signal is in the low state and off when the corresponding control signal is in the high state.

Between a time t0 and another time t1, subsequent to time t0, signals TGRSTZ, TGRSTG, MODE, RST1, and SMPRSTZ are in the high state. In each photosite 100G, 100Z, the charges are thus drained off from photodiode D1 by being transferred to photodiode D2 and the charges are drained off from photodiode D2 by being transferred to node 401 of application of power supply potential VRT via switch MTGRST. Further, the node SN1 of each photosite 100G, 100Z is reset by application of potential VRT via switch MRST. In photosite 100G, 100Z, the potential present at node SN1 after resetting is written into storage capacitive element C2 via transistor MSMPRSTZ. In this example, all the other switches are in the off state between times t0 and t1.

At time t1, signal RST1 for controlling the switches MRST of photosites 100G and 100Z is switched to the low state, signals TGRSTZ, TGRSTG, MODE, and SMPRSTZ being held in the high state. This results in turning off switches MRST and in storing potential VRT at the nodes SN1 of photosites 100G and 100Z.

At a time t2, subsequent to time t1, signals TGRSTZ, TGRSTG, MODE, and SMPRSTZ are switched to the low state. Between time t2 and a time t3, subsequent to time t2, a phase SAM of sampling of the charges photogenerated in the photodiode D2 of photosite 100Z is carried out. More precisely, the charges photogenerated in the photodiode D2 of photosite 100Z are periodically transferred to node SN1 by periodically controlling the transfer transistor MTG of photosite 100Z to the conductive state and then to the non-conductive state. Diode D2 is periodically reset by control of the transfer transistor MTGRST of photosite 100Z to the conductive state and then to the non-conductive state during phases where transistor MTG is in the non-conductive state.

In the shown example, signal TGRSTZ has a duty cycle equal to approximately ¾ and signal TGZ has a duty cycle equal to approximately ¼. Three other photosites of image sensor 300, for example, photosites 100Z next to the considered photosite 100Z, having signals TGRSTZ and TGZ phase-shifted by $\pi/2$, $\pi$, and $3\pi/2$ with respect to the signals TGRSTZ and TGZ illustrated in FIG. 6, may be used to sample the infrared radiation and trace back the value of phase shift $\Delta\varphi$. As a variant, signals TGRSTZ and TGZ having duty cycles respectively equal to ⅔ and ⅓ may be provided. In this case, two other photosites having signals TGRSTZ and TGZ each phase-shifted by $2\pi/3$ and $4\pi/3$ with respect to signals TGRSTZ and TGZ of photosite 100Z, for example, photosites 100Z next to the considered photosite 100Z, may be used to sample the infrared radiation.

At time t2, there also starts a phase INT of integration in the photodiode D1 of photosite 100Z and in the photodiodes D1 and D2 of photosite 100G. Integration phase INT stops at a time t4, subsequent to time t3. At time t3, signal TGRSTZ is switched to the high state and signal TGZ is switched to the low state. There are thus discharged, to node 401 of application of potential VRT, charges keeping on being photogenerated in photodiode D2 under the effect of the absorption of the infrared radiation and/or residual charges that may remain in photodiode D2. Between times t3 and t4, signal SMPSIGZ is first switched to the high state and then to the low state. This results in storing, in capacitive element C1, the voltage present at node SN1 (to within a gate-source voltage) obtained as a result of the accumulation of charges on this node during sampling phase SAM. Signals RST1, SMPRSTB, and SMPRSTG are then simultaneously switched to the high state, after which signal RTS1 is switched to the low state and finally signals SMPRSTB and SMPRSTG are switched to the low state. This enables to prepare the reading of the charges photogenerated by visible light by resetting the nodes SN1 of photosites 100Z and 100G so that the latter can subsequently receive the charges photogenerated in the photodiode D1 of photosite 100Z and in the photodiodes D1 and D2 of photosite 100G. The reset potentials applied to the nodes SN1 of photosites 100Z and 100G are stored in capacitive elements C3 and C6, respectively.

Between time t4 and a time t5, subsequent to time t4, signals TGZ, TGG, and MODE are simultaneously switched to the high state, then simultaneously switched to the low state. The charges stored in the photodiodes D1 of photosites 100Z and 100G are thus transferred to photodiode D2. In the case of photosite 100Z, photodiode D2 has been previously emptied of its charges photogenerated by the infrared radiation. In the case of photosite 100G, the charges photogenerated in photodiode D1 add to the charges photogenerated in photodiode D2. The charges located in the photodiode D2 of each photosite 100Z, 100G are further transferred to node SN1. Signals TGRSTZ and TGRSTG are maintained in the low state during these operations.

Signals SMPSIGB and SMPSIGG are then simultaneously switched to the high state, then simultaneously switched to the low state to write and store, in capacitive elements C4 and C5, the voltages of the nodes SN1 (to within a gate-source voltage) of photosites 100Z and 100G, obtained as a result of the charge transfers onto these nodes. Further, the signals TGRSTZ and TGRSTG of photosites 100Z and 100G are simultaneously switched to the high state to reset photodiodes D2 by draining off additional photogenerated charges, likely to fill photodiode D2. Signals SMPSIGB and SMPSIGG are then switched to the low state, while signals TGRSTZ and TGRSTG are held in the high state.

In the shown example, between a time t6, subsequent to time t5, and a time t7, subsequent to time t6, a read phase TRANS is performed during which the following operations are successively executed:

signal RDRSTZ is switched to the high state and then to the low state, to copy the voltage present across capacitive element C2 onto column Vx1 (to within a gate-source voltage);

signal RDSIGZ is switched to the high state and then to the low state, to copy the voltage present across capacitive element C1 onto column Vx1 (to within a gate-source voltage);

signals RDRSTB, RDRSTG are simultaneously switched to the high state, and then simultaneously switched to the low state, to copy the voltages present respectively across capacitive elements C3, C5 onto columns Vx1, Vx2 (to within a gate-source voltage); and signals RDSIGB, RDSIGG are simultaneously switched to the high state, and then simultaneously switched between the low state, to copy the voltages present respectively across capacitive elements C4, C6 onto columns Vx1, Vx2 (to within a gate-source voltage).

In this example, the capacitive elements coupled to a same column Vx1, Vx2 are successively read from while the capacitive elements coupled to different columns Vx1, Vx2 are simultaneously read from. After each copying onto one of columns Vx1, Vx2, the voltages are for example stored at the foot of a column by readout circuits.

FIG. 7 is an electric diagram of a circuit 700 for controlling four photosites of the type of the photosite 100 of FIG. 1 according to an embodiment.

In FIG. 7, there has been more precisely shown a photosite 100R, adapted to mainly capturing red light, two photosites 100G, adapted to mainly capturing green light, and one photosite 100Z adapted to mainly capturing blue light and an infrared radiation. Photosites 100R, 100G, and 100Z are for example identical or similar to photosite 100. In this example, photosites 100R, 100G, 100Z respectively comprise transfer transistors MTGR, MTGG, MTGZ similar to the transfer transistor MTG of photosite 100. In FIG. 7, transistors MTGR, MTGB, and MTGZ are each symbolized by a switch having a terminal connected to the cathode of photodiode D2 and having another terminal connected to the node SN1 of circuit 450 previously described in relation with FIG. 4.

More precisely, node SN1 is connected to the source terminal of transistor MRST and to the gate terminal of transistor MSF. The drain terminals of transistors MRST and MSF are each connected to the node 401 of application of potential VRT. Further, the source terminal of transistor MSF is connected to the drain terminal of transistor MB, the source terminal of transistor MB being connected to node 403.

Transistors MRST, MSF, and MB are for example distributed in the control circuits of photosites 100R, 100G, and 100Z. More precisely, in the shown example, transistor MRST forms part of the circuit for controlling photosite 100R, transistor MSF forms part of the circuit for controlling one of photosites 100G, and transistor MB forms part of the circuit for controlling photosite 100Z. As an example, the circuit for controlling the other photosite 100G may comprise a dummy transistor MD. This for example enables to provide identical or similar control circuits for all the photosites 100R, 100G, and 100Z of the sensor. The forming of the image sensor is thus eased.

An advantage of the control circuit 700 illustrated in FIG. 7 lies in the fact that it enables to implement a photosite architecture with four transistors, called "4T", instead of a photosite architecture with 6 transistors, called "6T". This results in a space and cost gain.

Although this has not been illustrated in FIG. 7, node SN2 of circuit 450 may be connected to a level identical or similar to the level 400B of the circuit 400 previously described in relation with FIG. 4. Those skilled in the art are capable of deducing the operation of the control circuit of FIG. 7 based on the indications provided hereabove in relation with FIGS. 4 and 6.

Figure 8:
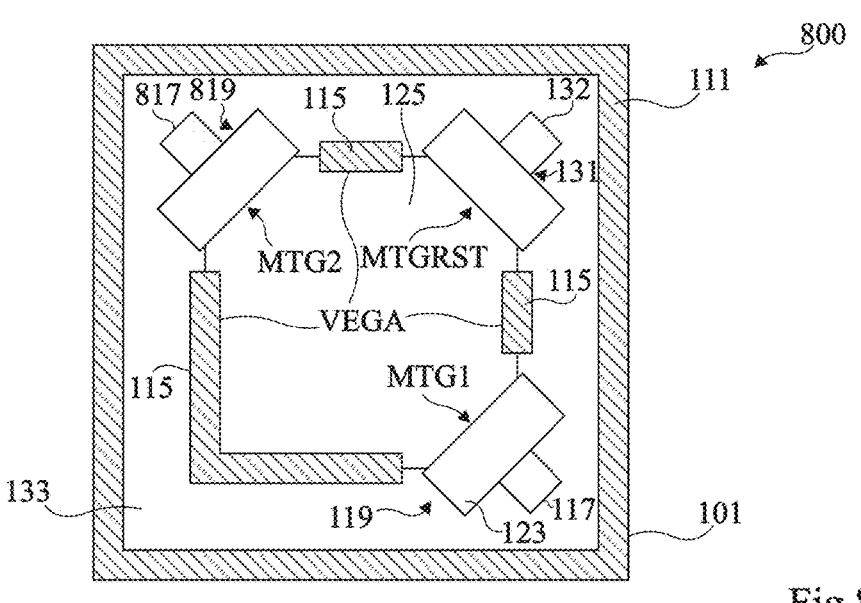
FIG. 8 is a simplified and partial top view of a photosite of an image sensor according to another embodiment.

FIG. 8 is a simplified and partial top view of an image sensor photosite 800 according to another embodiment. The photosite 800 of FIG. 8 comprises elements common with the photosite 100 of FIG. 1. These common elements will not be described again hereafter. The photosite 800 of FIG. 8 differs from the photosite 100 of FIG. 1 in that photosite 800 comprises, in addition to transfer transistor MTGRST, two other transfer transistors MTG1 and MTG2 identical or similar to the transfer transistor MTG of photosite 100.

More precisely, in the shown example, transistor MTG2 comprises an area 817 of collection of charges photogenerated in second photosensitive area 107 and a horizontal transfer gate 819 identical or similar, respectively, to area 117 and to the gate 119 of transistor MTG1.

To optimize the available space, transistors MTG1, MTG2, and MTGRST are for example, as illustrated in FIG. 8, arranged at three corners of the square formed by the peripheral insulating trench 111 of photosite 800. In this example, vertical transfer gate VEGA comprises three separate insulating trenches 115 laterally extending between the gates of transistors MTG1, MTG2, and MTGRST. The geometry of photosite 800 illustrated in FIG. 8 is not limiting, and those skilled in the art may provide any geometry adapted to the integration of three transfer transistors within a same photosite.

An advantage of photosite 800 lies in the fact that it enables to capture two samples of the received infrared light signal by means of a same depth image. This enables to gain still more resolution, or number of useful images for the capture of all the samples, with respect to photosite 100.

Figure 9:
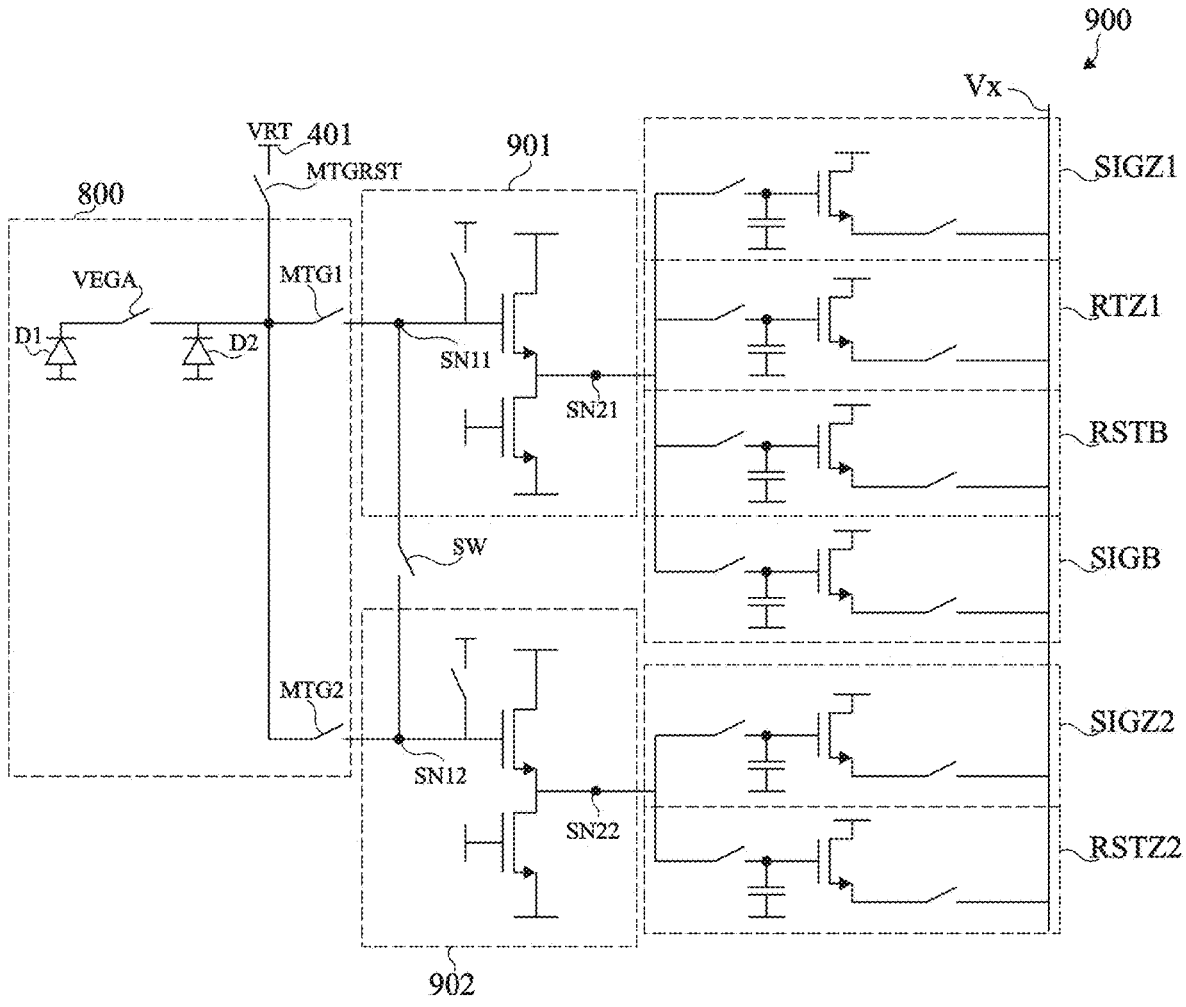
FIG. 9 is an electric diagram of a circuit for controlling the photosite of FIG. 8 according to an embodiment.

FIG. 9 is an electric diagram of a circuit 900 for controlling the photosite 800 of FIG. 8 according to an embodiment.

In the shown example, circuit 900 comprises two circuits 901 and 902, for example, each identical or similar to the circuit 450 of the circuit 400 of FIG. 4. More precisely, in this example, each circuit 901, 902 comprises a node SN11, SN12 similar to the node SN1 of circuit 450 of FIG. 4 and another node SN21, SN22 similar to the node SN2 of circuit 450. In the example illustrated in FIG. 9, the nodes SN11 and SN12 of circuits 901 and 902 are respectively connected to the transfer transistors MTG1 and MTG2 of photosite 800, for example, to the areas 117 and 817 of photosite 800.

In this example, circuit 900 further comprises branches SIGZ1, RSTZ1, RSTB, and SIGB coupling the node SN21 of circuit 901 to a column Vx and branches SIGZ2 and RSTZ2 coupling node SN22 to column Vx. The branches SIGZ1 and SIGZ2 of circuit 900 are for example identical or similar to the branch SIGZ of the circuit 400 of FIG. 4 and the branches RSTZ1 and RSTZ2 of circuit 900 are for example identical or similar to the branch RSTZ of circuit 400. Further, the branches RSTB and SIGB of circuit 900 are for example identical or similar to the branches RSTB and SIGB of circuit 400.

Those skilled in the art are capable of deducing the operation of the control circuit 900 of FIG. 9 from the operation of the control circuit 400 of FIG. 4 previously described in relation with FIGS. 4 and 6. In particular, during the sampling phase, transfer transistors MTG1 and MTG2 are controlled so that each transistor MTG1, MTG2 is conductive for one quarter of the period of the signal. During the remaining half of the period of the signal, transistor MTGRST is conductive while MTG1 and MTG2 are non-conductive. This advantageously enables to acquire two samples per photosite 800 by means of a same depth image.

Optionally, circuit 900 may further comprise a switch SW, for example, a MOS transistor, coupling the node SN11 of circuit 901 to the node SN12 of circuit 902. Switch SW couples for example transistor MTG1 to transistor MTG2, the switch for example more precisely comprising a terminal connected to area 117 and another terminal connected to the area 817 of photosite 800. In this case, when transistor MTG1 is in the conductive state to transfer the charges photogenerated in photosensitive area 103, in the case of photosite 100Z, or in photosensitive areas 103 and 107, in the case of photosites 100G and 100R, at the end of integration phase INT, switch SW may be controlled:

either to the off state (non-conductive transistor) to transfer the photogenerated charges to node SN11 only, control circuit 900 having in this case an operation similar to that of circuit 400; or or to the on state (conductive transistor) to distribute the transfer of the photogenerated charges to nodes SN11 and SN12, which are equivalent in this case to a single node having a capacitance approximately equal to twice the capacitance of a single one of nodes SN11 and SN12.

This advantageously enables to benefit from a double dynamic range, that is, two access to ranges of a pair formed by the "light intensity range" and "accuracy" parameters.

Figure 10:
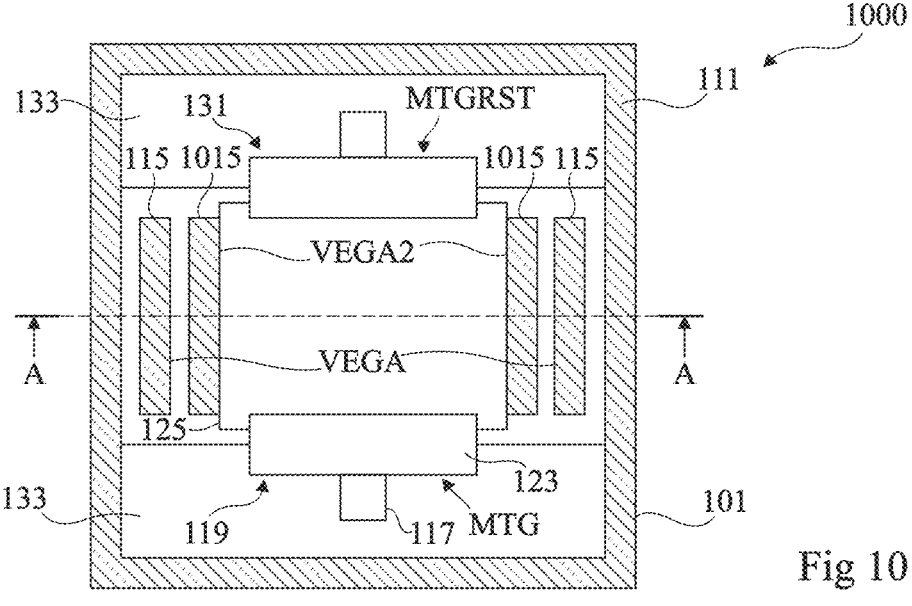
FIG. 10 is a simplified and partial top view of a photosite of an image sensor according to still another embodiment.
Figure 11A:
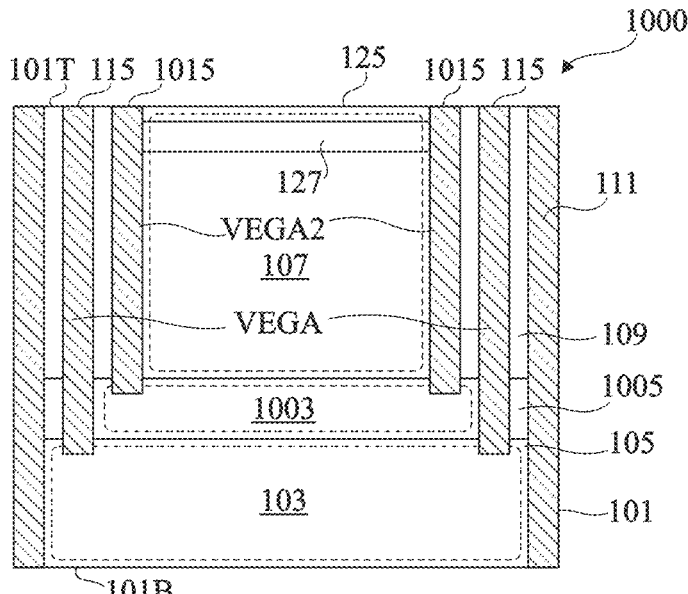
FIG. 11A is a cross-section view, along plane AA of FIG. 10, of the photosite of FIG. 10.

FIG. 10 is a simplified and partial top view of a photosite 1000 of an image sensor according to still another embodiment. FIG. 11A is a cross-section view, along plane AA of FIG. 10, of the photosite 1000 of FIG. 10.

The photosite 1000 of FIGS. 10 and 11A comprises elements common with the photosite 100 of FIGS. 1, 2A, and 2B. These common elements will not be described again hereafter. The photosite 1000 of FIGS. 10 and 11A differs from the photosite 100 of FIGS. 1, 2A, and 2B in that photosite 1000 comprises a third photosensitive area formed in semiconductor substrate 101 and interposed between the first and second photosensitive areas 103 and 107. Third photosensitive area 1003 is located vertically in line with the first and second photosensitive areas 103 and 107 (above first photosensitive area 103 and under second photosensitive area 107, in the orientation of the FIG. 11A). In top view, third photosensitive area 1003 for example has a periphery of substantially rectangular shape. Third photosensitive area 1003 for example has lateral dimensions smaller than those of first photosensitive area 103. More precisely, in top view, the rectangle formed by third photosensitive area 1003 extends between the trenches 115 of gate VEGA and between the two opposite walls of peripheral insulating trench 111 perpendicular to trenches 115. The third photosensitive area 1003 is for example formed in a seventh doped region 1005 of substrate 101 of the first conductivity type, type N in this example, and having a doping level N5. The doping rate N5 of the seventh region 1005 of substrate 101 is for example higher than the doping level N1 of first region 105 and lower than the doping level N2 of second region 109. In the shown example, the seventh region 1005 of substrate 101 is in contact, by its bottom surface, with the top surface of the underlying first region 105 and in contact, by its top surface, with the bottom surface of the overlying second region 109. Further, in this example, third photosensitive area 1003 is substantially in contact, by its bottom surface, with the top surface of the underlying first photosensitive area 103 and substantially in contact, by its top surface, with the bottom surface of the overlying second photosensitive area 107.

Third photosensitive area 1003 for example forms part of a third photosensitive diode D3, for example, a pinned photodiode having a pinning voltage Vpin3. In this example, the pinning voltage Vpin3 of third photodiode D3 is higher than the pinning voltage Vpin1 of first photodiode D1 and lower than the pinning voltage Vpin2 of second photodiode D2.

Each photosensitive area 103, 107, 1003 of photosite 100 is for example intended to collect incident photons, during phases of illumination of the image sensor comprising photosite 100, and to convert these photons into electron-hole pairs. In this example, first photosensitive area 103 is adapted to capturing light in a first wavelength range, second photosensitive area 107 is adapted to capturing light in a second wavelength range, different form the first wavelength range, and third photosensitive area 1003 is adapted to capturing light in a third wavelength range. The third wavelength range for example comprises the first and second wavelength ranges. As a variant, the third wavelength range may be located between the first and second wavelength ranges.

More precisely, the first and second photosensitive areas 103 and 107 are for example intended to respectively capture 2D images and depth images of a scene. As an example, the first photosensitive area 103 of photosite 1000 is adapted to capturing visible light, for example, blue light, and the second photosensitive areas 107 of photosite 1000 is adapted to capturing an infrared radiation, for example, a near-infrared radiation, when photosite 1000 is illuminated on the side of its bottom surface 101B. The third photosensitive area 1003 of photosite 1000 is then for example adapted to capturing both visible light and a near-infrared radiation.

In the example illustrated in FIGS. 10 and 11A, photosite 1000 further comprises, in addition to transfer gate VEGA adapted to transferring the charges photogenerated in first photosensitive area 103 to third photosensitive area 1003, another vertical transfer gate VEGA2 adapted to transferring the charges photogenerated in third photosensitive area 1003 to second photosensitive area 107. More precisely, a circuit for controlling photosite 1000 may be used to alternately apply, to vertical transfer gate VEGA2:

a fifth potential adapted to blocking a charge transfer from third photosensitive area 1003 to second photosensitive area 107; or a sixth potential, different from the fifth potential, adapted to allowing a charge transfer from third photosensitive area 1003 to second photosensitive area 107.

In this example, vertical transfer gate VEGA2 comprises two separate insulating trenches 1015, for example, capacitive insulating trenches. As illustrated in FIG. 11A, each insulating trench 1015 of vertical transfer gate VEGA2 vertically extends across the thickness of semiconductor substrate 101 from the top surface 101T of substrate 101 to third photosensitive area 1003, and partially penetrates into third photosensitive area 1003 down to a depth smaller than that of vertical transfer gate VEGA. In other words, each insulating trench 1015 stops across the thickness of the seventh region 1005 of substrate 101 and does not emerge into the first region 105 of substrate 101. In this example, each insulating trench 1015 totally crosses the second region 109 of substrate 101 and partially penetrates into seventh region 1005.

In the shown example, insulating trenches 1015 form two plates substantially parallel to each other and bordering two opposite lateral surfaces of second photosensitive area 107. In this example, insulating trenches 1015 are further, in top view, substantially parallel to two opposite sides of peripheral insulating trench 111 and to the insulating trenches 115 of vertical transfer gate VEGA. In the shown example, vertical transfer gate VEGA surrounds vertical transfer gate VEGA2, each trench 115 of gate VEGA being interposed between a trench 1015 of gate VEGA2 and a wall of trench 111.

Each insulating trench 1015 of vertical transfer gate VEGA2 for example has a structure similar to that of the insulating trenches 115 of vertical transfer gate VEGA. More precisely, although this has not been detailed in FIGS. 10 and 11A, each insulating trench 1015 for example comprises an electrically-conductive region, for example made of polysilicon or of a metal, for example, copper, or of a metal alloy. Further, each trench 1015 for example comprises an electrically-insulating layer coating the lateral walls and the bottom surface of the electrically-conductive region. The electrically-conductive region of each insulating trench 1015 is for example electrically-insulated from the electrically-conductive region of trenches 115 and from peripheral insulating trench 111. This for example enables to bias the electrically-conductive regions of insulating trenches 1015 independently from the electrically-conductive region of trenches 115 and from peripheral insulating trench 111.

The first charge collection area 117 of photosite 1000 is for example common to the charges photogenerated in the first, second, and third photosensitive areas 103, 107, and 1003.

As an example, photosite 1000 is for example associated with a control circuit identical or similar to the control circuit 400 of FIG. 4.

Those skilled in the art are capable of deducing the operation of the photosite 1000 of FIGS. 10 and 11A from the operation of the photosite 100 of FIGS. 1, 2A, and 2B previously described in relation with FIGS. 4 and 6. In particular, the time variation of the control signals is for example similar to that previously described in relation with the timing diagram of FIG. 6, but comprises an additional step of removal, in a case where the third wavelength range includes the first and second wavelength ranges, or of transfer, in a case where the third wavelength range is located between the first and second wavelength ranges, of the charges photogenerated in third photosensitive area 1003. More precisely, the removal or transfer step takes place, for example, after the reading, from node SN1, of the charges photogenerated by the infrared radiation and before the transfer of the charges photogenerated in photodiode D1 to node SN1, for example before the switching to the high state of signal MODE at time t4. In the case where the step prior to step t4 is a removal step, vertical transfer gate VEGA2 is for example switched to the conductive state to transfer the charges from the third photosensitive area 1003 to photodiode D2 and then to node 401 of application of potential VRT, for example, by turning off transistor MTGRST or by successively turning off transistor MTG and then transistor MRST. The adaptation of the operation to the case where the step prior to step t4 is a transfer step is within the abilities of those skilled in the art based on the above indications.

Various embodiments and variants have been described. Those skilled in the art will understand that certain features of these various embodiments and variants may be combined, and other variants will occur to those skilled in the art. In particular, the embodiment of the photosite 1000 of FIGS. 10 and 11A may be combined with the embodiment of the photosite 800 of FIG. 8.

Although there have been described hereabove examples of photosites 100, 800, 1000 where the regions 105 and 109 of substrate 101 having the first and second photosensitive areas 103 and 107 formed therein are doped with the same conductivity type, type N in this example, it may alternatively be provided for regions 105 and 109 to have opposite conduction types. As an example, region 105 could be doped with the first conductivity type, type N in this example, and region 109 could be doped with the second conductivity type, type P in this example. In this case, the charge transfer from first photosensitive area 103 to second photosensitive area 107 would be performed not across the volume, as in the case where regions 105 and 109 are of the same conductivity type, but through channels located along the sides of the trenches 115 of vertical transfer gate VEGA.

Further, although examples of photosites 100, 800, 1000 where first photosensitive area 103 is adapted to mainly capturing blue light have been described hereabove, it could as a variant be provided for first photosensitive area 103 to be adapted to mainly capturing green light. In this case, the thickness of first photosensitive area 103 could for example be increased with respect to second photosensitive area 107, to optimize the absorption of green light in first photosensitive area 103.

Finally, the practical implementation of the described embodiments and variants is within the abilities of those skilled in the art based on the functional indications given hereabove. In particular, the described embodiments are not limited to the specific examples of materials and of dimensions mentioned in the present disclosure.

The invention claimed is:

1. Image sensor comprising a plurality of photosites formed inside and on top of a semiconductor substrate, each photosite comprising:

a first photosensitive area formed in the semiconductor substrate and adapted to capturing light in a first wavelength range;

a second photosensitive area formed in the semiconductor substrate vertically in line with the first photosensitive area and adapted to capturing light in a second wavelength range, different from the first wavelength range;

a first charge collection area photogenerated in the first and second photosensitive areas, arranged on the side of a surface of the substrate opposite to the first photosensitive area;

a first transfer gate vertically extending from the first photosensitive area to said surface, adapted to transferring the charges photogenerated in the first photosensitive area to the second photosensitive area; and a second transfer gate, horizontally extending on said surface vertically in line with the second photosensitive area, adapted to transferring the photogenerated charges from the second photosensitive area to the first charge collection area.

2. Sensor according to claim 1, wherein the first transfer gate comprises at least first and second plates parallel to each other, the second photosensitive area laterally extending from a surface of the first plate to a surface of the second plate located in front of the first plate.

3. Sensor according to claim 1, wherein each photosite further comprises:

at least one second area of collection of charges photo-generated in the second photosensitive area, arranged on the side of said surface; and at least one third transfer gate laterally extending on said surface, vertically in line with the second photosensi-tive area.

4. Sensor according to claim 1, wherein each photosite further comprises:

a third photosensitive area, interposed between the first and second photosensitive areas; and a fourth transfer gate vertically extending, from the third photosensitive area, all the way to said surface and adapted to transferring the charges photogenerated in the third photosensitive area to the second photosensi-tive area.

5. Sensor according to claim 4, wherein the first charge collection area is common to the charges photogenerated in the first, second, and third photosensitive areas.

6. Sensor according to claim 4, wherein the first transfer gate surrounds the fourth transfer gate.

7. Sensor according to claim 1, wherein each photosite further comprises a peripheral insulating trench vertically extending in the semiconductor substrate, from said surface, and laterally delimiting the first photosensitive area.

8. Sensor according to claim 1, wherein each photosite further comprises a control circuit configured to alternately apply, on the first transfer gate:

a first potential adapted to blocking a charge transfer from the first photosensitive area to the second photosensi-tive area; and a second potential, different from the first potential, adapted to allowing a charge transfer from the first photosensitive area to the second photosensitive area.

9. Sensor according to claim 8, wherein the control circuit is configured to alternately apply, on the second transfer gate:

a third potential adapted to blocking a charge transfer from the second photosensitive area to the first charge storage area; and a fourth potential, different from the third potential, adapted to allowing a charge transfer from the second photosensitive area to the first charge storage area.

10. Sensor according to claim 1, further comprising a fifth transfer gate, horizontally extending on said surface verti-cally in line with the second photosensitive area, the fifth transfer gate being adapted to transferring photogenerated charges from the second photosensitive area to a second charge collection area.

11. Sensor according to claim 10, wherein the second and fifth transfer gates are successively opened during a phase of sampling of charges photogenerated in the second photo-sensitive area.

12. Sensor according to claim 10, wherein the second and fifth transfer gates are coupled together by a switch.

13. Sensor according to claim 1, wherein the first and second photosensitive areas of the photosites of the sensor are adapted to respectively capture a 2D image and a depth image of a scene.

14. Sensor according to claim 1, wherein the first and second photosensitive areas are doped with the same con-ductivity type.

15. Sensor according to claim 1, wherein the first photo-sensitive area is doped with a first conductivity type and the second photosensitive area is doped with a second conduc-tivity type, opposite to the first conductivity type.

16. Device comprising:

an image sensor according to claim 1;

an infrared radiation emission source; and a circuit for controlling the infrared radiation emission source and the image sensor.

* * * * *